United States Patent
Kitano et al.

(10) Patent No.: US 9,142,619 B2
(45) Date of Patent: Sep. 22, 2015

(54) GROUP III NITRIDE SEMICONDUCTOR DEVICE AND METHOD FOR MANUFACTURING THE SAME

(75) Inventors: Tsukasa Kitano, Aichi (JP); Koichi Naniwae, Aichi (JP); Masayoshi Koike, Aichi (JP); Fumiharu Teramae, Aichi (JP); Toshiyuki Kondo, Aichi (JP); Atsushi Suzuki, Aichi (JP); Tomohiko Maeda, Aichi (JP); Midori Mori, Aichi (JP)

(73) Assignee: EL-SEED CORPORATION, Nagoya-Shi, Aichi (JP)

( * ) Notice: Subject to any disclaimer, the term of this patent is extended or adjusted under 35 U.S.C. 154(b) by 0 days.

(21) Appl. No.: 13/704,963

(22) PCT Filed: Nov. 25, 2011

(86) PCT No.: PCT/JP2011/077240
§ 371 (c)(1),
(2), (4) Date: Jan. 22, 2013

(87) PCT Pub. No.: WO2012/077513
PCT Pub. Date: Jun. 14, 2012

(65) Prior Publication Data
US 2013/0126907 A1 May 23, 2013

(30) Foreign Application Priority Data
Dec. 8, 2010 (JP) ................... 2010-273209

(51) Int. Cl.
*H01L 29/16* (2006.01)
*H01L 21/02* (2006.01)
(Continued)

(52) U.S. Cl.
CPC ........ *H01L 29/1608* (2013.01); *H01L 21/0254* (2013.01); *H01L 21/02107* (2013.01);
(Continued)

(58) Field of Classification Search
CPC ................ H01L 2924/00; H01L 2924/00014; H01L 2224/32245; H01L 29/16; H01L 21/02; C07C 13/64; C07C 23/20
USPC .................. 257/77, 103, 76, 79, 98
See application file for complete search history.

(56) References Cited

U.S. PATENT DOCUMENTS

2006/0091408 A1* 5/2006 Kim et al. ............. 257/94
2007/0176531 A1 8/2007 Kinoshita et al.
(Continued)

FOREIGN PATENT DOCUMENTS

CN 101443887 A 5/2009
JP 7-273367 A 10/1995
(Continued)

OTHER PUBLICATIONS

International Search Report (ISR) (PCT Form PCT/ISA/210) dated Jan. 10, 2012, in PCT/JP2011/077240.
(Continued)

*Primary Examiner* — Chuong A Luu
*Assistant Examiner* — Rodolfo Fortich
(74) *Attorney, Agent, or Firm* — McGinn IP Law Group, PLLC

(57) ABSTRACT

[Problem] To provide a group III nitride semiconductor device and a method for manufacturing the same in which dislocation density in a semiconductor layer can be precisely reduced.
[Solution] In manufacturing a group III nitride semiconductor device 1, a mask layer 40 is formed on a substrate 20, followed by selectively growing nanocolumns 50 made of a group III nitride semiconductor through a pattern 44 of the mask layer 40 in order to grow a group III nitride semiconductor layer 10 on the mask layer 40.

20 Claims, 6 Drawing Sheets

(51) Int. Cl.
*H01L 33/00* (2010.01)
*H01L 33/20* (2010.01)
*H01L 33/32* (2010.01)

(52) U.S. Cl.
CPC .... *H01L21/02378* (2013.01); *H01L 21/02458* (2013.01); *H01L 21/02603* (2013.01); *H01L 21/02631* (2013.01); *H01L 21/02639* (2013.01); *H01L 33/007* (2013.01); *H01L 33/20* (2013.01); *H01L 33/32* (2013.01)

(56) References Cited

U.S. PATENT DOCUMENTS

| | | | |
|---|---|---|---|
| 2008/0036038 | A1 | 2/2008 | Hersee et al. |
| 2008/0107876 | A1* | 5/2008 | Yi et al. ............ 428/201 |
| 2009/0169828 | A1* | 7/2009 | Hersee et al. ........ 428/172 |
| 2009/0243043 | A1* | 10/2009 | Wang ................ 257/615 |
| 2009/0269909 | A1 | 10/2009 | Kim et al. |
| 2010/0163840 | A1 | 7/2010 | Seifert et al. |
| 2010/0276665 | A1* | 11/2010 | Wang ................. 257/15 |

FOREIGN PATENT DOCUMENTS

| | | |
|---|---|---|
| JP | 2006-128627 A | 5/2006 |
| JP | 2007-27298 A | 2/2007 |
| JP | 2007-273367 A | 10/2007 |
| JP | 4153455 B2 | 9/2008 |
| JP | 2009-9978 A | 1/2009 |
| JP | 2009-542560 A | 12/2009 |
| JP | 2010-515651 A | 5/2010 |
| JP | 2010-518615 A | 5/2010 |
| JP | 2010-157603 A | 7/2010 |
| TW | 200901284 A | 1/2009 |

OTHER PUBLICATIONS

Stephen D. Hersee, Xinyu Sun, and Xin Wang, The Controlled Growth of Gan Nanowires, NANO Letters, Jul. 26, 2006, vol. 6, No. 8, pp. 1808-1811.
S. Ishizawa el al, Selective growth of GaN nanocolumns with AlN patterns on Si substrate by RF-MBE, Lecture proceedings, The Japan Society of Applied Physics vol. 69 No. 1, p. 338, 5a-CG-4 & its English translation.
Notification of Reason(s) for Refusal drafted May 31, 2011.
Notification of Reason(s) for Refusal drafted Aug. 17, 2011.
Decision of Refusal dated Nov. 21, 2011 with English Translation.
Chinese Office Action dated Jun. 2, 2015 with English translation.

* cited by examiner

FIG. 3
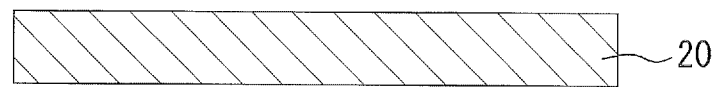
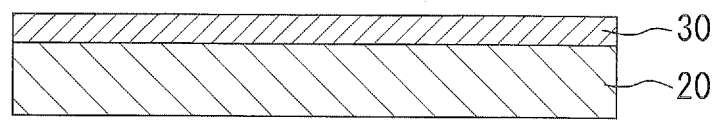
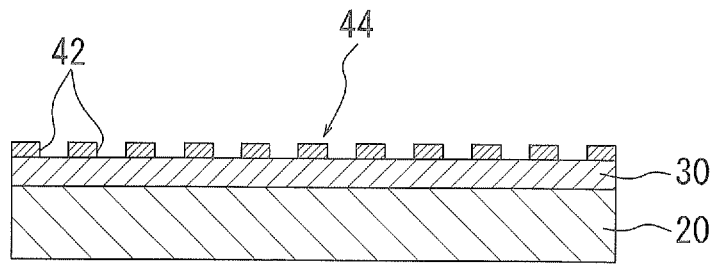
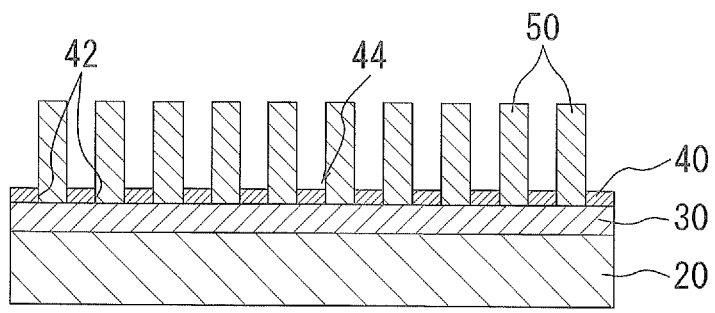

FIG. 4
(a) 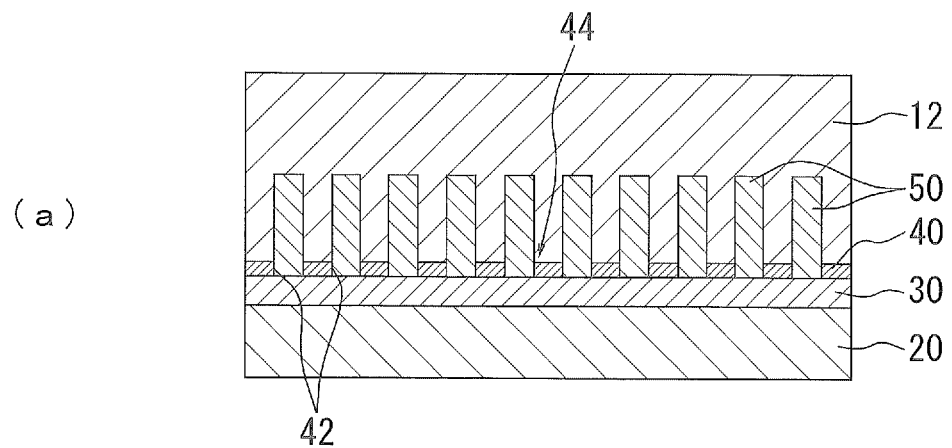
(b) 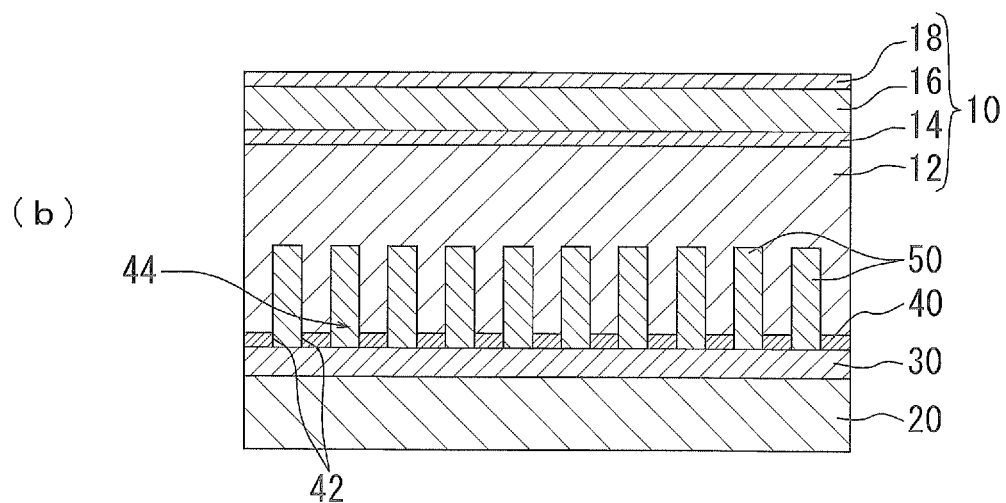
(c) 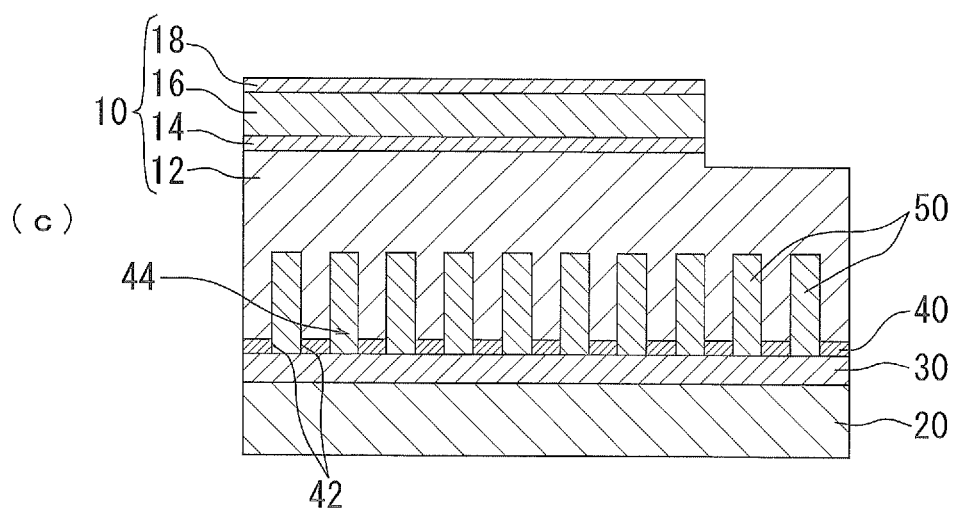

GROUP III NITRIDE SEMICONDUCTOR DEVICE AND METHOD FOR MANUFACTURING THE SAME

TECHNICAL FIELD

The present invention relates to a group III nitride semiconductor device and a method for manufacturing the same.

BACKGROUND ART

There has been known an LED element containing a GaN-based semiconductor layer formed on an SiC substrate (e.g. see Patent Literature 1). The LED element uses a fluorescent SiC substrate having a first SiC layer in which B and N are doped and a second SiC layer in which Al and N are doped and releases near-ultraviolet light from a multiple quantum well active layer. Near-ultraviolet light, which is absorbed in the first SiC layer and the second SiC layer, is converted from green visible light to red visible light in the first SiC layer and converted from blue visible light to red visible light in the second SiC layer. As a result, white light which is close to sunlight with a high rendering property is released from the fluorescent SiC substrate.

However, the LED element is accompanied by high dislocation density in the GaN-based semiconductor layer due to a lattice mismatch and a difference in the coefficient of thermal expansion between the SiC substrate and the GaN-based semiconductor layer. As a result, a problem arises with difficulty in increasing the thickness and lowering the resistance in the GaN-based semiconductor layer.

There is proposed a method to form a GaN film on a substrate via a buffer layer by MOCVD, after which nanocolumns are formed by etching the GaN film using metal and a dielectric nanomask in order to reduce dislocation density in a semiconductor layer on the substrate (e.g. see Patent Literature 2). According to this method, after formation of the nanocolumns, a GaN-based semiconductor layer is grown on the buffer layer and the nanocolumns by using lateral growth.

CITATION LIST

Patent Literature

[Patent Document 1] Japanese Patent No. 4153455
[Patent Document 2] Japanese Unexamined Patent Application Publication No. 2010-518615

SUMMARY OF INVENTION

Technical Problem

In the method according to Patent Literature 2, however, dislocation density remains high in a U—GaN film formed on the substrate, which also causes high dislocation density in the nanocolumns themselves to be formed by etching the U—GaN film. As a result, dislocation is propagated through the GaN-based semiconductor layer which is formed on the nanocolumns and the effect of decreasing dislocation density in the GaN-based semiconductor layer is insufficient.

The present invention was achieved in view of the above circumstances and has an object to provide a group III nitride semiconductor device and a method for manufacturing the same in which dislocation density in a semiconductor layer can be precisely reduced.

Solution to Problem

In order to achieve the above object, the present invention provides a group III nitride semiconductor device having a substrate made of SiC or Si, a mask layer which is formed on the substrate and includes formation of a predetermined pattern, nanocolumns to be selectively grown through the pattern of the mask layer and made of a group III nitride semiconductor, and a group III nitride semiconductor layer which is grown to be higher than the nanocolumns on the mask layer.

According to the group III nitride semiconductor device, the nanocolumns are selectively grown through the mask layer and therefore dislocation density in the nanocolumns themselves can be reduced. As a result, dislocation propagated from the nanocolumns to the group III nitride semiconductor layer formed on the mask layer is significantly reduced to allow reduction of dislocation density in the group III nitride semiconductor layer. In addition, dislocation which occurred in the group III nitride semiconductor layer at the growth of the group III nitride semiconductor layer is terminated at an interface to the nanocolumns and therefore not propagated upward.

In the above group III nitride semiconductor device, the mask layer is preferably made of an amorphous material.

According to the group III nitride semiconductor device, the mask layer which is made of an amorphous material prevents firm connection between the group III nitride semiconductor layer and the mask layer. Therefore, in response to excessive stress occurring between the group III nitride semiconductor layer and the mask layer, slippage is allowed between the group III nitride semiconductor layer and the mask layer. As a result, reduction of dislocation density in the group III nitride semiconductor layer is achieved.

In the above group III nitride semiconductor device, it is preferable to interpose a buffer layer made of a group III nitride semiconductor including Al between the substrate and the mask layer.

According to the group III nitride semiconductor device, owing to the buffer layer which includes Al, the group III nitride semiconductor layer can be precisely grown on the substrate without causing the group III nitride semiconductor and the substrate to fiercely react to each other at an interface therebetween as observed when, for example, GaN is grown directly on a substrate made of SiC or Si.

Moreover, in order to achieve the above object, the present invention provides a method for manufacturing the above group III nitride semiconductor device by including a mask layer formation process to form the mask layer on the substrate, a nanocolumn growth process to selectively grow the nanocolumns made of a group III nitride semiconductor through the pattern of the mask layer, and a semiconductor layer growth process to grow the group III nitride semiconductor layer on the mask layer.

According to the method for manufacturing the group III nitride semiconductor device, the nanocolumns can be grown by using the mask layer which was formed on the substrate and the group III nitride semiconductor layer can also be grown on the mask layer as it is. Accordingly, a mask layer removing process which has been carried out in the conventional method is unnecessary and reduction of manufacturing costs can be achieved.

In addition, in order to achieve the above object, the present invention provides a method for manufacturing the above group III nitride semiconductor device by including a buffer layer formation process to form the buffer layer on the substrate by the sputtering method, a mask layer formation process to form the mask layer on the substrate on which the buffer layer was formed, a nanocolumn growth process to selectively grow the nanocolumns made of a group III nitride semiconductor through the pattern of the mask layer, and a semiconductor layer growth process to grow the group III nitride semiconductor layer on the mask layer.

According to the method for manufacturing the group III nitride semiconductor device, the mask layer is formed on the substrate to grow the nanocolumns on the mask layer as it is and the group III nitride semiconductor layer can be formed on the mask layer. Accordingly, a mask layer removing process which has been carried out in the conventional method is unnecessary and reduction of manufacturing costs can be achieved.

In addition, due to formation of the buffer layer by the sputtering method, a growth process at a low temperature becomes possible to improve mass productivity. Furthermore, in comparison with the MOCVD method or other methods, a crystal structure of good quality with fewer defects can be obtained.

Advantageous Effects of Invention

According to the present invention, dislocation density in the semiconductor layer can be precisely reduced.

BRIEF DESCRIPTION OF THE DRAWINGS

FIG. 3 illustrates a process of manufacturing the LED element, including FIG. 3a illustrating a state of a substrate, FIG. 3b illustrating a state that a buffer layer was grown, FIG. 3c illustrating a state that a mask layer was formed, and FIG. 3d illustrating a state that the nanocolumns were grown.

FIG. 4 illustrates a process of manufacturing the LED element, including FIG. 4a illustrating a state that an n-type layer was grown out of a group III nitride semiconductor layer, FIG. 4b illustrating a state that the group III nitride semiconductor layer was grown entirely, and FIG. 4c illustrating a state that the group III nitride semiconductor layer was partially etched.

DESCRIPTION OF EMBODIMENTS

Figure 1:
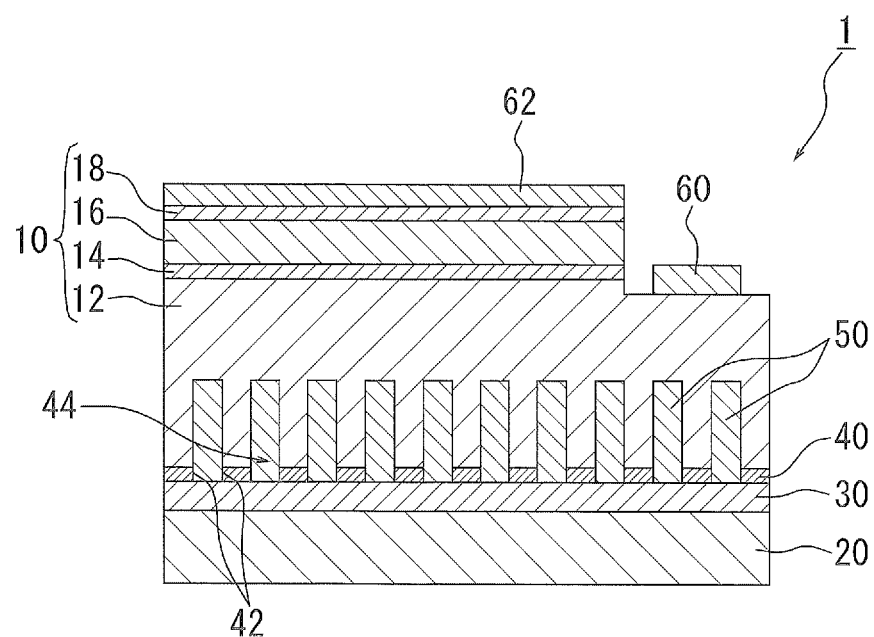
FIG. 1 is a schematic cross sectional view of an LED element, exhibiting one embodiment of the present invention.

FIG. 1 to FIG. 5 illustrate one embodiment of the present invention and FIG. 1 is a schematic cross sectional view of an LED element.

As shown in FIG. 1, an LED element 1 serving as a group III nitride semiconductor device is provided with a group III nitride semiconductor layer 10 which is expressed by $Al_xGa_yIn_{1-x-y}N$ ($0 \leq x \leq 1$, $0 \leq y \leq 1$, $x+y \leq 1$) and a substrate 20 whose thermal expansion coefficient is less than that of the group III nitride semiconductor layer 10. In the present embodiment, the substrate 20 is made of single crystal 6H-type SiC with a thermal expansion coefficient of $4.2 \times 10^{-6}/°C$. The nitride semiconductor layer serving as a semiconductor light emitting part has a thermal expansion coefficient of $5.6 \times 10^{-6}/°C$.

The substrate 20 includes donor impurities and acceptor impurities and when it is excited by light emitted from the group III nitride semiconductor layer 10, light of a predetermined wavelength is emitted by donor-acceptor pair emission. For example, when a bulk SiC substrate is used with donor impurities of N and acceptor impurities of B, excitation by ultraviolet light causes emission of visible light which is roughly yellow to orange. Also, in the case of using a bulk SiC substrate with donor impurities of N and acceptor impurities of Al, excitation by ultraviolet light causes emission of visible light which is roughly blue. Note that any changes can be made for the wavelength of light emitted from the substrate such that visible light of pure white can be obtained by simultaneously adding B and Al as acceptor impurities while maintaining donor impurities of N or the wavelength of emitted light can be shifted to a short wavelength by forming SiC porously.

A buffer layer 30 made of a group III nitride semiconductor is formed on the substrate 20. The buffer layer 30 is made of a material which is expressed by a formula of $Al_xGa_yIn_{1-x-y}N$ ($0 \leq x \leq 1$, $0 \leq y \leq 1$, $x+y \leq 1$). In the present embodiment, for the buffer layer 30, a buffer layer 30 which is expressed by a formula of $Al_xGa_{1-x}N$ ($0 < x \leq 1$) and includes Al is used.

A mask layer 40 made of an amorphous material is formed on the buffer layer 30. A pattern 42 for formation of nanocolumns 50 to be described later is formed in the mask layer 40. In the present embodiment, $SiO_2$ is used for the mask layer 40. Note that, needless to say, other materials such as $SiN_x$ ($0<x$) may also be used for the mask layer 40. Further, materials such as $Al_2O_3$ and W can also be used for the mask layer 40. These materials may be either polycrystalline or amorphous.

Figure 2:
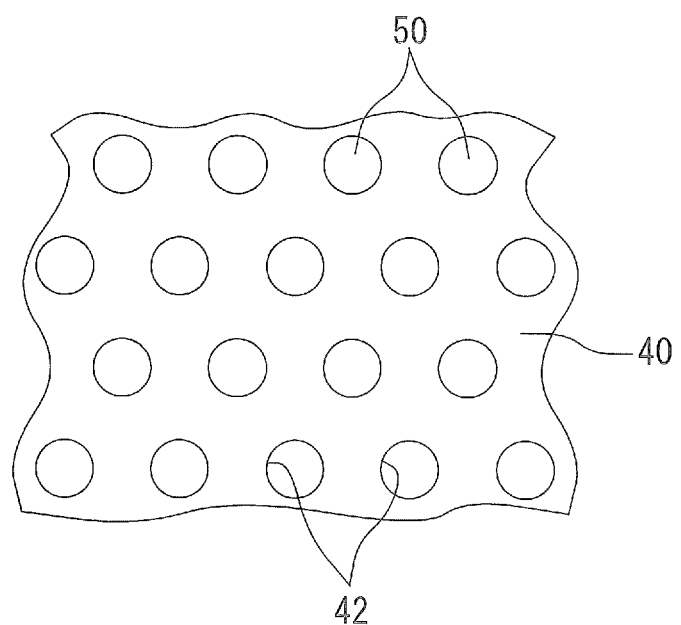
FIG. 2 is a top surface explanatory diagram of the LED element with nanocolumns formed by using a pattern of a mask layer.

As shown in FIG. 2, the pattern 42 of the mask layer 40 is formed such that circular holes 44 are arranged at intersection points in an equilateral triangular lattice. The holes 44 which may have any diameters and intervals can be arranged with, for example, a diameter of each of the holes 44 in a range of 50 to 1000 nm and an interval between the holes 44 adjacent to each other in a range of 100 to 1000 nm.

The nanocolumns 50 are grown through the pattern 42 of the mask layer 40 via the buffer 30. In the present embodiment, GaN is used for the nanocolumns 50. The nanocolumns 50 are grown corresponding to the pattern 42 so that dislocation density is made smaller than the case of growing them without the mask layer 40. In the present embodiment, the nanocolumns 50 can be formed into a cylindrical shape with an aspect ratio of 1 or more. Note that the nanocolumns 50 may be formed into any shapes other than a cylindrical shape as long as being formed into a columnar shape.

The group III nitride semiconductor layer 10 is formed on the mask layer 40. The group III nitride semiconductor layer 10 includes an n-type layer 12, a multiple quantum well active layer 14, a p-type cladding layer 16 and a p-type contact layer 18 to be formed from the substrate 20 side in this order. The group III nitride semiconductor layer 10 is partially removed by etching to partially expose the n-type layer 12 and the exposed area is used for arranging an n-side electrode 60. A p-side electrode 62 is also formed on the p-type contact layer 18.

In the present embodiment, the n-type layer 12 is formed of n-GaN obtained by doping a predetermined amount of n-type dopant (e.g. Si). The multiple quantum well active layer 14 also has a multiple quantum well structure formed by $In_xGa_{1-x}N$ ($0 \leq x \leq 1$)/$Al_yGa_{1-y}N$ ($0 \leq y \leq 1$). Furthermore, each of the p-type cladding layer 16 and the p-type contact layer 18 is formed by p-GaN obtained by doping a predetermined amount of p-type dopant (e.g. Mg).

Layers from the n-type layer 12 to the p-type contact layer 18 are formed by epitaxial growth of a group III nitride semiconductor. Note that any layer structures can be employed in the group III nitride semiconductor layer 10 as long as including at least a first conductive layer, an active layer and a second conductive layer and allowing the active layer to emit light by recombined electrons and positive holes in response to voltage application to the first conductive layer and the second conductive layer.

The n-side electrode 60 which is formed on the n-type layer 12 is made of, for example, Ni—Au and formed by the vacuum deposition method, sputtering method and CVD (Chemical Vapor Deposition) method or other methods. The p-side electrode 62 which is formed on the p-type contact layer 18 is made of, for example, ITO (Indium Tin Oxide) and formed by the vacuum deposition method, sputtering method and CVD (Chemical Vapor Deposition) method or other methods.

Figure 5:
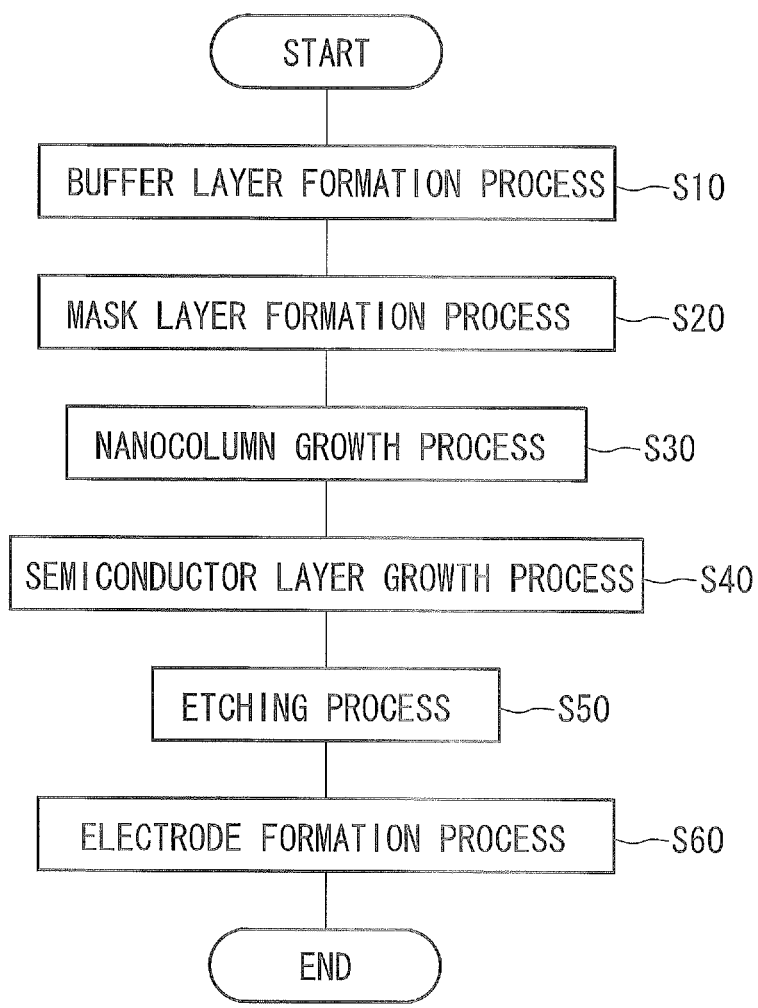
FIG. 5 is a flowchart illustrating a process of manufacturing the LED element.

Next, a method for manufacturing the LED element 1 will be explained with reference to FIG. 3 to FIG. 5. FIG. 3 and FIG. 4 are a schematic cross sectional view of the LED element and FIG. 5 is a flowchart of the method for manufacturing the LED element. Note that the LED element is illustrated by the unit of one element in FIG. 3 and FIG. 4 so as to correspond to FIG. 1 for explanation, but it is actually provided in a wafer state before element separation and other elements are formed continuously to the left and right thereof.

Firstly, single crystal 6H-type SiC is generated in a bulk state containing donor impurities and acceptor impurities that were doped by the sublimation method. Note that doping concentration of impurities in the SiC crystal can be controlled by adding impurity gas to atmospheric gas and adding an impurity element or a compound thereof to base powder at the growth of the crystal. As shown in FIG. 3a, the substrate 20 is fabricated by creating a bulk crystal of, for example, about 30 mm resulting from bulk growth by the sublimation method and passing through processes such as outer periphery grinding, slicing, surface grinding and surface polishing. Here, the substrate 20 which may have any thicknesses is set to have a thickness of, for example, 250 µm.

Thereafter, as shown in FIG. 3b, the buffer layer 30 is grown epitaxially on the surface 20 (i.e. buffer layer formation process S10 in FIG. 5). In the present embodiment, the buffer layer 30 is formed to cover the entire surface on the substrate 20 by the sputtering method. Note that the buffer layer 30 can also be formed by the MOCVD (Metal Organic Chemical Vapor Deposition) method, the MBE (Molecular Beam Epitaxy) method and the HVPE (Halide Vapor Phase Epitaxy) method or other methods. In addition, the buffer layer 30 can also be formed by the laser ablation method. Here, the buffer layer 30 which may have any thicknesses is set to have a thickness of, for example, 10 to 200 nm.

Next, as shown in FIG. 3c, the mask layer 40 is formed above the substrate 20 on which the buffer layer 30 was formed (i.e. mask layer formation process S20 in FIG. 5). In the present embodiment, the mask layer 40 is formed to cover the entire surface on the buffer layer 30 by the vacuum deposition method. Here, the mask layer 40 which may have any thicknesses is set to have a thickness of, for example, 10 to 200 nm. With the thickness of this level, effects of inhibiting transmission of light emitted from an active layer by the mask layer 40 will be small. Moreover, if light is extracted by using the action of interference of light, it is unnecessary to take the above inhibiting effects into consideration and therefore the mask layer 40 may be set to be thick enough to achieve the action of interference. Thereafter, the pattern 44 is formed in the mask layer 40 by using the nanoimprint technique.

Then, as shown in FIG. 3d, the pattern 42 of the mask layer 40 is used to grow the nanocolumns 50 epitaxially (i.e. nanocolumn growth process S30 in FIG. 5). In the present embodiment, the pattern 42 of the mask layer 40 is used to selectively grow the nanocolumns 50 on the buffer layer 30 by the MOCVD method. Note that, needless to say, the MBE method and the HVPE method or other methods may also be used to grow the nanocolumns 50. The nanocolumns 50 which may have any heights are set to have a height of, for example, 500 nm. In the present embodiment, the nanocolumns 50 are selectively grown above the substrate 20, whereby dislocation density in the nanocolumns 50 is extremely small in comparison with a case of growing a semiconductor layer to cover the entire surface on the substrate 20.

When formation of the nanocolumns 50 is completed, the group III nitride semiconductor layer 10 is grown (i.e. semiconductor layer growth process in FIG. 5). In the present embodiment, the nanocolumns 50 and the group III nitride semiconductor layer 10 are grown continuously in the MOCVD device. Here, the V/III ratio is preferably smaller in the nanocolumn growth process than in the semiconductor growth process. For example, the V/III ratio can be less than 900 in the nanocolumn growth process. If the V/III ratio is too large at the growth of the nanocolumns, a semiconductor which is to be grown cannot be formed into a columnar shape. It is also preferable to supply a smaller amount of gallium in the nanocolumn growth process than in the semiconductor layer growth process. If a supply amount of gallium is too large in the nanocolumn growth process, a semiconductor may be grown into crystals in an island state on the mask to be integrated with the nanocolumns or the nanocolumns may have various shapes.

In the present embodiment, after formation of the n-type layer 12 so as to fill in the nanocolumns 50 as shown in FIG. 4a, the multiple quantum well active layer 14, the p-type cladding layer 16 and the p-type contact layer 18 are grown sequentially from the mask layer 40 side as shown in FIG. 4b. At this time, in the group III nitride semiconductor layer 10 which is grown on the mask layer 40, dislocation occurring in the inside is terminated in an area to be in contact with sidewalls of the nanocolumns 50, whereby dislocation density can be reduced. Also, owing to low dislocation density in the nanocolumns 50 themselves, dislocation propagated from the nanocolumns 50 is extremely rare.

In addition, because the nanocolumns 50 and the group III nitride semiconductor layer 10 are formed continuously by the MOCVD device after formation of the buffer layer 30 by a sputtering device, the manufacturing process can be shortened in comparison with a case of growing the buffer layer 30 by the MOCVD device. Therefore, manufacturing costs of the light emitting element 1 can be reduced.

Moreover, owing to absence of a mask layer formation process interposed between the nanocolumn growth process and the semiconductor layer growth process, the group III nitride semiconductor layer 10 of a good quality can be obtained. If the mask layer 40 which is amorphous is formed after formation of the nanocolumns 50 made of a group III nitride semiconductor, the surface of the nanocolumns 50 is deteriorated by the components of the mask layer 40 and the deteriorated nanocolumns 50 are used as a seed to grow the group III nitride semiconductor layer 10, wherein the group III nitride semiconductor layer 10 of a good quality is difficult to obtain.

Furthermore, the mask layer 40 made of an amorphous material prevents the group III nitride semiconductor layer 10 formed on the mask layer 40 from being firmly connected to the mask layer 40. Therefore, if excessive stress occurs between the group III nitride semiconductor layer 10 and the mask layer 40, relative slippage of the group III nitride semiconductor layer 10 and the mask layer 40 is permissible. This will also contribute to reduction of dislocation density in the group III nitride semiconductor layer 10.

Note that each of layers in the group III nitride semiconductor layer 10 may have any thicknesses but can also be set such that, for example, the n-type layer 12 has a thickness of 3 μm, the multiple quantum well active layer 14 has a thickness of 100 nm, the p-type cladding layer 16 has a thickness of 80 nm, and the p-type contact layer 18 has a thickness of 10 nm. Thus, the group III nitride semiconductor layer 10 can be set to have a thickness of 3 μm or more. After the growth of the group III nitride semiconductor layer 10, a mask made of photoresist is formed on the p-type contact layer 18 by using the photolithography technique and etching is made from the p-type contact layer 18 to the surface of the n-type layer 12, after which the mask is removed (i.e. etching process S50 in FIG. 5). Therefore, a mesa part composed of a plurality of compound semiconductor layers including the n-type layer 12 to the p-type contact layer 18 is formed as shown in FIG. 4c Then, the vacuum deposition method and the photolithography technique are used to form the n-side electrode 60 and the p-side electrode 62 (i.e. electrode formation process S60 in FIG. 5). Although the present embodiment uses different materials for the n-side electrode 60 and the p-side electrode 62, the n-side electrode 40 and the p-side electrode 62 can be formed simultaneously by using the same material. Note that a heat treatment can be applied at a predetermined temperature under a predetermined atmosphere for a predetermined period of time in order to ensure ohmic contact and adhesiveness between each of the electrodes 60 and 62 and the group III nitride semiconductor layer 10. Thereafter, the completed device is divided into a plurality of the LED elements 1 by dicing and thus the LED element 1 is manufactured.

In the LED element 1 which is structured as stated above, ultraviolet light is emitted from the multiple quantum well active layer 14 in response to voltage application to the p-side electrode 62 and the n-side electrode 60. Then, ultraviolet light is converted into visible light by the substrate 20 and emitted to the outside.

According to the LED element 1, the nanocolumns 50 are selectively grown through the mask layer 40 and therefore reduction of dislocation density in the nanocolumns 50 themselves can be achieved. As a result, dislocation propagated from the nanocolumns 50 to the group III nitride semiconductor layer 10 formed on the mask layer 40 is significantly reduced to achieve reduction of dislocation density in the group III nitride semiconductor layer 10. Dislocation which occurred in the group III nitride semiconductor layer 10 at the growth of the group III nitride semiconductor layer 10 is terminated at the interface to the nanocolumns 50 and therefore not propagated upward. Accordingly, reduction of dislocation density in the group III nitride semiconductor 10 can be precisely achieved.

Also, according to the LED element 1, the buffer layer 30 which includes Al prevents the group III nitride semiconductor and the substrate from fiercely reacting to each other at the interface therebetween as observed when, for example, GaN is grown directly on a substrate made of SiC or Si, so that the group III nitride semiconductor layer 10 can be precisely grown on the substrate 20.

Moreover, according to the method for manufacturing the LED element 1, the nanocolumns 50 can be grown by using the mask layer 40 which was formed on the substrate 20 and the group III nitride semiconductor layer 10 can also be grown on the mask layer 40 as it is. Accordingly, a mask layer removal process which has been carried out in the conventional method is unnecessary and therefore reduction of manufacturing costs can be achieved.

Furthermore, owing to formation of the buffer layer 30 and the nanocolumns 50 by the sputtering method, a growth process at a low temperature becomes possible to improve mass productivity. In addition, the buffer layer can be formed into a crystal structure of good quality with fewer defects than that formed by the MOCVD method or other methods.

Note that the present invention, which was applied to the LED element 1 serving as a semiconductor device in the example shown in the above embodiment, is also applicable to other devices such as, for example, LD element. Applicable devices include, for example, electronic devices such as field effect transistors and bipolar transistors and solar cells or the like.

Figure 6:
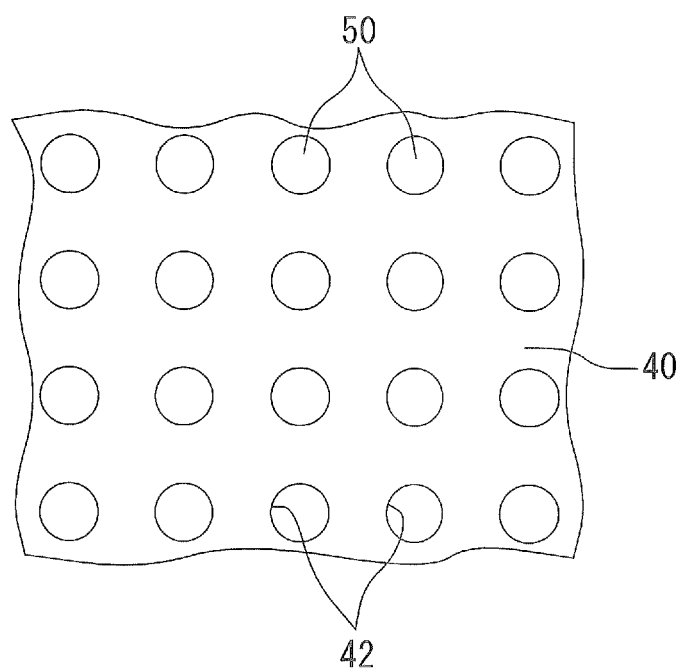
FIG. 6 is a top surface explanatory diagram illustrating a modified example of the LED element with the nanocolumns formed by using a pattern of the mask layer.

Although the nanocolumns 50 are arranged at intersection points in a triangular lattice according to the above embodiment, any changes can be made for the arrangement of the nanocolumns and, for example, arrangement at intersection points in a square lattice as shown in FIG. 6 may also be applied.

In addition, even though the present embodiment uses 6H-type SiC for the substrate 20, 4H-type Sic or 15R-type. SiC may also be used as a matter of course and Si may also be used for the substrate 20. Furthermore, the substrate 20 may not need to have a fluorescence function and light of any colors may be emitted from the group III nitride semiconductor layer 10.

Although the embodiment of the present invention is as explained above, the embodiment described above does not limit the invention relating to the scope of claims. It should also be noted that entire combinations of features explained in the embodiment are not necessarily essential to the means for solving the problem in the invention.

REFERENCE SIGNS LIST

1 LED ELEMENT
10 GROUP III NITRIDE SEMICONDUCTOR LAYER
12 n-TYPE LAYER
14 MULTIPLE QUANTUM WELL ACTIVE LAYER
16 p-TYPE CLADDING LAYER
18 p-TYPE CONTACT LAYER
20 SUBSTRATE
30 BUFFER LAYER
40 MASK LAYER
42 HOLE
44 PATTERN
50 NANOCOLUMN
60 n-SIDE ELECTRODE
62 p-SIDE ELECTRODE

The invention claimed is:

1. A group III nitride semiconductor device, comprising:
a substrate comprising SiC;
a mask layer formed on the substrate and including a predetermined periodic pattern;
nanocolumns selectively grown through the predetermined pattern of the mask layer and comprising a group III nitride semiconductor; and
a group III nitride semiconductor layer disposed directly on the mask layer formed on the substrate and grown to be higher than the nanocolumns so as to fill in a gap between the nanocolumns,
wherein top surfaces of the nanocolumns are located higher than an upper surface of the mask layer.

2. The group III nitride semiconductor device according to claim 1, wherein the mask layer comprises an amorphous material.

3. The group III nitride semiconductor device according to claim 2, wherein a buffer layer comprising a group III nitride semiconductor including Al is interposed between the substrate and the mask layer.

4. The group III nitride semiconductor device according to claim 1, wherein the group III nitride semiconductor layer comprises a filling layer filling in the gap between the nanocolumns and a multiple quantum well active layer parallel to the substrate.

5. The group III nitride semiconductor device according to claim 1, wherein the group III nitride semiconductor layer comprises a multiple quantum well active layer that extends parallel to the substrate.

6. The group III nitride semiconductor device according to claim 5, wherein the multiple quantum well active layer comprises $In_xGa_{1-x}(0 \leq x \leq 1)/Al_yGa_{1-y}N$ $(0 \leq y \leq 1)$.

7. The group III nitride semiconductor device according to claim 1, wherein the gap comprises a plurality of gaps each located between adjacent nanocolumns of the nanocolumns such that the group III nitride semiconductor layer fills said each of the gaps.

8. The group III nitride semiconductor device according to claim 1, wherein the group III nitride semiconductor layer extends from a side surface of one of the nanocolumns to a side surface of another one of the nanocolumns.

9. The group III nitride semiconductor device according to claim 1, wherein the group III nitride semiconductor layer fills in an entirety of the gap between the nanocolumns.

10. The group III nitride semiconductor device according to claim 1, wherein the group III nitride semiconductor layer comprises:
    an n-type layer that fills in the gap between the nanocolumns;
    a multiple quantum well active layer disposed on an upper surface of the n-type layer;
    a p-type cladding layer disposed on an upper surface of the multiple quantum well active layer; and
    a p-type contact layer disposed on an upper surface of the p-type cladding layer.

11. The group III nitride semiconductor device according to claim 10, wherein an n-side electrode is disposed on the upper surface of the n-type layer, and a p-side electrode is disposed on an upper surface of the p-type contact layer.

12. A method for manufacturing a group III nitride semiconductor device that comprises: a substrate comprising SiC; a mask layer formed on the substrate and including a predetermined periodic pattern; nanocolumns selectively grown through the predetermined pattern of the mask layer and comprising a group III nitride semiconductor; and a group III nitride semiconductor layer disposed directly on the mask layer formed on the substrate and grown to be higher than the nanocolumns so as to fill in a gap between the nanocolumns, wherein top surfaces of the nanocolumns are located higher than an upper surface of the mask layer, the method comprising:
    a mask layer formation process to form the mask layer on the substrate;
    a nanocolumn growth process to selectively grow the nanocolumns comprising the group III nitride semiconductor through the predetermined pattern of the mask layer; and
    a semiconductor layer growth process to grow the group III nitride semiconductor layer on the mask layer.

13. A method for manufacturing a group III nitride semiconductor device that comprises: a substrate comprising SiC; a mask layer formed on the substrate and including a predetermined periodic pattern; nanocolumns selectively grown through the predetermined pattern of the mask layer and comprising a group III nitride semiconductor; and a group III nitride semiconductor layer disposed directly on the mask layer formed on the substrate and grown to be higher than the nanocolumns so as to fill in a gap between the nanocolumns, wherein top surfaces of the nanocolumns are located higher than an upper surface of the mask layer, wherein the mask layer comprises an amorphous material, and wherein a buffer layer comprising a group III nitride semiconductor including Al is interposed between the substrate and the mask layer, the method comprising:
    a buffer layer formation process to form the buffer layer on the substrate by a sputtering method;
    a mask layer formation process to form the mask layer on the substrate provided with the buffer layer formed thereon;
    a nanocolumn growth process to selectively grow the nanocolumns comprising the group III nitride semiconductor through the predetermined pattern of the mask layer; and
    a semiconductor layer growth process to grow the group III nitride semiconductor layer on the mask layer.

14. A method for manufacturing a group III nitride semiconductor device that comprises: a substrate comprising SiC; a mask layer formed on the substrate and including a predetermined periodic pattern; nanocolumns selectively grown through the predetermined pattern of the mask layer and comprising a group III nitride semiconductor; and a group III nitride semiconductor layer disposed directly on the mask layer formed on the substrate and grown to be higher than the nanocolumns so as to fill in a gap between the nanocolumns, wherein top surfaces of the nanocolumns are located higher than an upper surface of the mask layer, wherein the mask layer comprises an amorphous material, and wherein a buffer layer comprising a group III nitride semiconductor including Al is interposed between the substrate and the mask layer, the method comprising:
    a mask layer formation process to form the mask layer on the substrate;
    a nanocolumn growth process to selectively grow the nanocolumns comprising the group III nitride semiconductor through the predetermined pattern of the mask layer; and
    a semiconductor layer growth process to grow the group III nitride semiconductor layer on the mask layer.

15. A method for manufacturing a group III nitride semiconductor device that comprises: a substrate comprising SiC; a mask layer formed on the substrate and including a predetermined periodic pattern; nanocolumns selectively grown through the predetermined pattern of the mask layer and comprising a group III nitride semiconductor; and a group III nitride semiconductor layer disposed directly on the mask layer formed on the substrate and grown to be higher than the nanocolumns so as to fill in a gap between the nanocolumns, wherein top surfaces of the nanocolumns are located higher than an upper surface of the mask layer, wherein the mask layer comprises an amorphous material, and wherein a buffer layer comprising a group III nitride semiconductor including Al is interposed between the substrate and the mask layer, the method comprising:
    a mask layer formation process to form the mask layer on the substrate;
    a nanocolumn growth process to selectively grow the nanocolumns comprising the group III nitride semiconductor through the predetermined pattern of the mask layer; and
    a semiconductor layer growth process to grow the group III nitride semiconductor layer on the mask layer.

16. A method for manufacturing a group III nitride semiconductor device that comprises: a substrate comprising SiC; a mask layer formed on the substrate and including a predetermined periodic pattern; nanocolumns selectively grown through the predetermined pattern of the mask layer and comprising a group III nitride semiconductor; and a group III nitride semiconductor layer disposed directly on the mask layer formed on the substrate and grown to be higher than the nanocolumns so as to fill in a gap between the nanocolumns, wherein top surfaces of the nanocolumns are located higher than an upper surface of the mask layer, the method comprising:

a mask layer formation process to form the mask layer on the substrate;

a nanocolumn growth process to selectively grow the nanocolumns comprising the group III nitride semiconductor through the predetermined pattern of the mask layer; and a semiconductor layer growth process to grow the group III nitride semiconductor layer on the mask layer.

17. A group III nitride semiconductor device, comprising:
a substrate;
a mask layer disposed on the substrate and including a predetermined periodic pattern;
nanocolumns disposed through the predetermined pattern of the mask layer and comprising a group III nitride semiconductor; and
a group III nitride semiconductor layer disposed directly on the mask layer formed on the substrate, extending above the nanocolumns, and filling in gaps between the nanocolumns.

18. The group III nitride semiconductor device according to claim 17, wherein the substrate comprises SiC, and wherein the group III nitride semiconductor layer fills an entirety of the gaps between the nanocolumns.

19. The group III nitride semiconductor device according to claim 17, wherein the group III nitride semiconductor layer comprises a filling layer filling in the gap between the nanocolumns and a multiple quantum well active layer that extends parallel to the substrate.

20. The group III nitride semiconductor device according to claim 17, wherein the group III nitride semiconductor layer comprises:

an n-type layer that fills the gap between the nanocolumns;

a multiple quantum well active layer disposed on an upper surface of the n-type layer;

a p-type cladding layer disposed on an upper surface of the multiple quantum well active layer; and a p-type contact layer disposed on an upper surface of the p-type cladding layer, wherein an n-side electrode is disposed on an upper surface of the n-type layer, and a p-side electrode is disposed on an upper surface of the p-type contact layer.

* * * * *